(12) United States Patent
Kuro et al.

(10) Patent No.: US 8,859,341 B2
(45) Date of Patent: Oct. 14, 2014

(54) MANUFACTURING METHOD OF SEMICONDUCTOR DEVICE

(75) Inventors: Yuuki Kuro, Mie-gun (JP); Makoto Minaminaka, Suzuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 737 days.

(21) Appl. No.: 12/553,217

(22) Filed: Sep. 3, 2009

(65) Prior Publication Data

US 2010/0062572 A1 Mar. 11, 2010

(30) Foreign Application Priority Data

Sep. 5, 2008 (JP) ................................ 2008-227884

(51) Int. Cl.
*H01L 21/00* (2006.01)
*H01L 21/56* (2006.01)

(52) U.S. Cl.
CPC ..... *H01L 21/565* (2013.01); *H01L 2224/48227* (2013.01); *H01L 2225/06568* (2013.01)
USPC ........... 438/127; 438/112; 438/124; 438/126; 264/239; 264/272.11; 264/272.13; 264/272.14; 264/272.17

(58) Field of Classification Search
USPC .................. 438/112, 124, 126, 127; 264/239, 264/272.11, 272.13, 272.14, 272.17
See application file for complete search history.

(56) References Cited

U.S. PATENT DOCUMENTS

| | | | | |
|---|---|---|---|---|
| 5,698,152 A | * | 12/1997 | Taruno et al. | 264/272.11 |
| 5,998,509 A | * | 12/1999 | Hayase et al. | 523/425 |
| 6,120,716 A | | 9/2000 | Kushida et al. | |
| 6,852,263 B2 | * | 2/2005 | Kuroyanagi et al. | 264/272.13 |
| 6,905,768 B2 | * | 6/2005 | Tada et al. | 428/413 |
| 6,906,425 B2 | * | 6/2005 | Stewart et al. | 257/778 |
| 2001/0045671 A1 | * | 11/2001 | Kuroyanagi et al. | 257/788 |
| 2003/0027899 A1 | * | 2/2003 | Takasaki et al. | 523/400 |
| 2006/0214153 A1 | * | 9/2006 | Ikezawa et al. | 257/40 |
| 2006/0223235 A1 | | 10/2006 | Ito et al. | |
| 2008/0169552 A1 | * | 7/2008 | Taya et al. | 257/690 |
| 2009/0326100 A1 | * | 12/2009 | Hamada et al. | 523/435 |

FOREIGN PATENT DOCUMENTS

EP  1 630 861 A1  3/2006
JP  3-3258  1/1991

(Continued)

OTHER PUBLICATIONS

Japanese Office Action issued Oct. 18, 2011 in patent application No. 2008-227884 with English translation.

(Continued)

*Primary Examiner* — Bac Au
(74) *Attorney, Agent, or Firm* — Oblon, Spivak, McClelland, Maier & Neustadt, L.L.P.

(57) ABSTRACT

A semiconductor chip which is mounted on a wiring substrate and which is electrically connected to the wiring substrate is disposed in a sealing apparatus. A sealing resin material made of a thermosetting resin composition is supplied into the sealing apparatus. The sealing resin material contains a solid foreign matter having a cured product of a thermosetting resin, and includes particulates of the thermosetting resin composition pulverized with the solid foreign matter, a granulation powder of the particulates, or a preform of the particulates. The semiconductor chip is resin sealed by using the sealing resin material.

12 Claims, 8 Drawing Sheets

(56) References Cited

FOREIGN PATENT DOCUMENTS

| | | |
|---|---|---|
| JP | 2002-327044 A | 11/2002 |
| JP | 2004-56141 | 2/2004 |
| JP | 2004-235530 | 8/2004 |
| JP | 2006-88619 | 4/2006 |
| JP | 2007-67164 | 3/2007 |
| WO | WO99/08321 | 2/1999 |
| WO | WO 2005/106942 A1 | 11/2005 |

OTHER PUBLICATIONS

Office Action issued Jun. 5, 2012 in Japanese Patent Application No. 2008-227884 (with English-language translation).

* cited by examiner

MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2008-227884, filed on Sep. 5, 2008. The entire contents of Japanese Patent Application stated above are incorporated herein by reference.

BACKGROUND OF THE INVENTION

In a semiconductor device (semiconductor package), with a tendency of more multi-step layers of semiconductor chips, a higher density of an internal wiring, and a thinner package, a package whose sealing resin on semiconductor chips has a thickness of approximately 100 to 150 µm is required. With regard to resin sealing of a semiconductor chip, in transfer molding, there occurs a problem that a resin cannot be sufficiently filled on the semiconductor chip in a case of a package having a sealing resin with a thin thickness on the semiconductor chip, or there occurs a problem that a short circuit occurs between wirings due to deformation of a metal wire in a case of high density internal wiring with the metal wires. In order to solve the above problems, application of compression molding to resin sealing of a semiconductor chip is considered (see JP-A 2004-056141 (KOKAI) and JP-A 2006-088619 (KOKAI)).

In compression molding, for example, a thermosetting resin composition in granular form generated in a process to manufacture a tablet of the thermosetting resin composition (sealing resin material) to be used in transfer molding is used. A conventional granular thermosetting resin composition (sealing resin material) is fabricated as follows, for example. First, respective materials of an uncured thermosetting resin, a curing agent, a filler and the like are weighed and mixed, and the mixture is kneaded. A kneading step is performed while heating to approximately 100° C. in general so that the respective materials are uniformly mixed. On this occasion, some resins reside for a long time in the kneading step, and there is a possibility that a curing reaction proceeds and a cured product is generated. Such a cured product is called an acetone insoluble matter.

Next, a kneaded product of the respective materials is extended to form a sheet, cooled and then ground, whereby the granular sealing resin material (uncured thermosetting resin composition) is fabricated. In the grinding step of the kneaded product, a particle diameter of the resin composition is approximately several ten µm to 2 mm in general. Thus, if the sealing resin material contains a cured product (acetone insoluble matter) of the thermosetting resin, its particle diameter varies from approximately several ten µm to 2 mm. In a sealing resin material generally used, a cured product (acetone insoluble matter) of a thermosetting resin is contained at a rate of several ten ppm.

If resin sealing of a semiconductor chip by compression molding is performed by using the granular sealing resin material described above, there may be caused a problem such that the cured product (acetone insoluble matter) of the thermosetting resin contained in the sealing resin material damages the semiconductor chip or deforms an internal wiring by a metal wire. In a compression molding method, a semiconductor chip is disposed in a cavity of a sealing apparatus and a sealing resin material is supplied thereon. A thermosetting sealing resin material is heated while being pressurized. The sealing resin material fluidized by pressurizing and heating is filled in the cavity.

On this occasion, if the sealing resin material contains an acetone insoluble matter with a large particle diameter, a large pressure is locally applied on the semiconductor chip via the acetone insoluble matter sandwiched between the semiconductor chip and a pressuring mold. The above causes a scratch, a crack or the like in the semiconductor chip. If the acetone insoluble matter with the large particle diameter exists between an internal wiring by a metal wire and a pressurizing mold, there is a possibility that the pressurizing mold presses the acetone insoluble matter against the internal wiring, thereby deforming the internal wiring. In a thinned semiconductor device, there is a tendency that a thickness of a sealing resin on a semiconductor chip is made thinner. In such a case, in particular, an acetone insoluble matter tends to give an adverse influence to the semiconductor chip or an internal wiring.

Further, based on an increase of density or improvement of function of a semiconductor chip, in an internal wiring (metal wire) electrically connecting the semiconductor chip and a wiring substrate or the like, a layout pitch is tend to be minuter. If a sealing resin material contains an acetone insoluble matter with a large particle diameter, there is a possibility that the acetone insoluble matter sandwiched between the neighboring metal wires deforms the metal wire, causing a short circuit between the metal wires. Further, even if a short failure does not occur, there is a possibility that a leak occurs between the neighboring metal wires. The short failure or the like between the metal wires due to the acetone insoluble matter may occur not only in resin sealing by compression molding but also in resin sealing to which transfer molding is applied.

SUMMARY OF THE INVENTION

A manufacturing method of a semiconductor device according to an aspect of the present invention includes: setting a sealing resin material, which is made of a thermosetting resin composition, containing a solid foreign matter having a cured product of the thermosetting resin composition in a sealing apparatus, the sealing resin material including particulates of the thermosetting resin composition pulverized with the solid foreign matter, a granulation powder of the particulates, or a preform of the particulates; setting a semiconductor chip mounted on a circuit substrate and electrically connecting to the circuit substrate in the sealing apparatus; and sealing the semiconductor chip by a cured product of the sealing resin material.

A manufacturing method of a semiconductor device according to another aspect of the present invention includes: setting a sealing resin material, which is made of a thermosetting resin composition, containing a solid foreign matter having a cured product of the thermosetting resin composition in a sealing apparatus for compression molding, the sealing resin material including particulates of the thermosetting resin composition pulverized with the solid foreign matter, a granulation powder of the particulates, or a preform of the particulates; setting a semiconductor chip mounted on a circuit substrate and electrically connecting to the circuit substrate in the sealing apparatus; heating and fluidizing the sealing resin material; pressurizing the fluidized sealing resin material while heating to cover the semiconductor chip by the fluidized sealing resin material; and thermosetting the sealing resin material to seal the semiconductor chip by a cured product of the sealing resin material.

DETAILED DESCRIPTION OF THE INVENTION

Hereinafter, embodiments to implement the present invention will be described with reference to the drawings.

Figure 1:
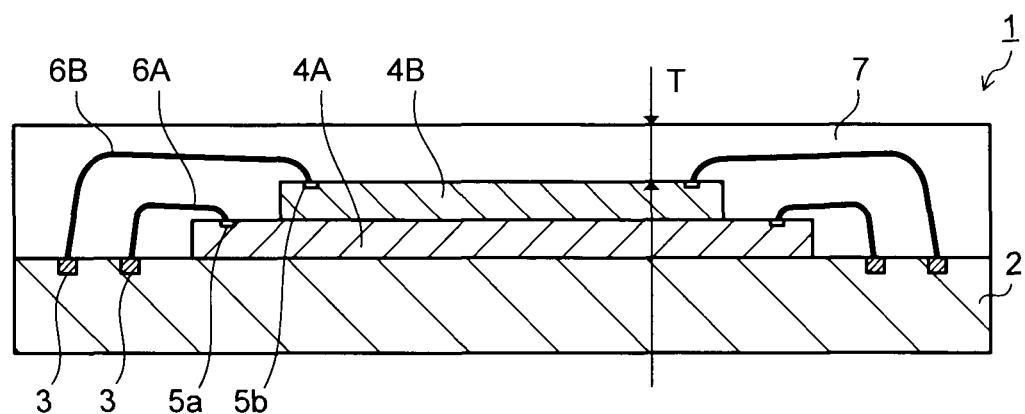
FIG. 1 is a cross-sectional view showing a constitution example of a semiconductor device to which a manufacturing method of an embodiment is applied.

First, a constitution of a semiconductor device to which an embodiment of the present invention is applied will be described with reference to FIG. 1. FIG. 1 shows a constitution example of the semiconductor device, and a manufacturing method of this embodiment is not limited to manufacture of the semiconductor device shown in FIG. 1. The manufacturing method of this embodiment can be applied to resin sealing of various semiconductor chips which are mounted on circuit substrates such as wiring boards or lead frames and which are electrically connected to the circuit substrates via internal wirings such as metal wires.

The semiconductor device shown in FIG. 1 includes a wiring board 2 as a circuit substrate. The wiring substrate 2 includes a connection pad 3 to be a connection portion at a time of wire bonding. A plurality of semiconductor chips 4A, 4B are mounted and stacked on a first surface (upper surface) of the wiring substrate 2. Electrode pads 5a, 5b of the semiconductor chips 4A, 4B are electrically connected to connection pads 3 of the wiring substrate 2 via metal wires (internal wirings) 6A, 6B, respectively.

On the first surface of the wiring substrate 2, a sealing resin layer 7 made of a cured product of a thermosetting resin such as an epoxy resin is formed. The semiconductor chips 4A, 4B as well as the metal wires 6A, 6B are integrally sealed with the sealing resin layer 7. An external connection terminal (not shown) is formed on a second surface (lower surface) of the wiring substrate 2 as necessary. When the semiconductor device 1 is used as a semiconductor package, a projecting electrode by a solder ball is applied as the external connection terminal. When the semiconductor device 1 is used as a semiconductor memory card, the external connection terminal is constituted by a plating electrode.

In order to make the semiconductor device (semiconductor package) 1 shown in FIG. 1 thin, for example, a thickness (resin thickness-on-chip) T of the sealing resin layer 7 on the semiconductor chip 4B is in a range of 100 to 150 μm. When the resin thickness-on-chip T is 150 μm or less, a solid foreign matter contained in a sealing resin material being a material to form the sealing resin layer 7 is liable to give an adverse influence to the semiconductor chip 4 or the metal wire 6. The manufacturing method of the embodiment is preferable for fabrication of a semiconductor device (semiconductor package) 1 of which the resin thickness-on-chip T is 150 μm or less.

Though a constitution in which two semiconductor chips 4A, 4B are mounted and stacked on the wiring substrate 2 is shown in FIG. 1, the number of mounted semiconductor chips 4 may be one or three or more, not being limited in particular. As a concrete structure of the resin sealing type semiconductor device 1, there can be cited, for example, a structure in which one or plural memory chip (s) is (are) mounted and stacked on the wiring substrate 2, further a structure in which a controller chip is stacked on a highest stage thereof, or a structure in which a memory chip and a logic chip are mounted and stacked on the wiring substrate 2. A connecting structure of the semiconductor chip 4 and the wiring substrate 2 is not limited to wire connection but flip-chip connection can be applied thereto.

Figure 2:
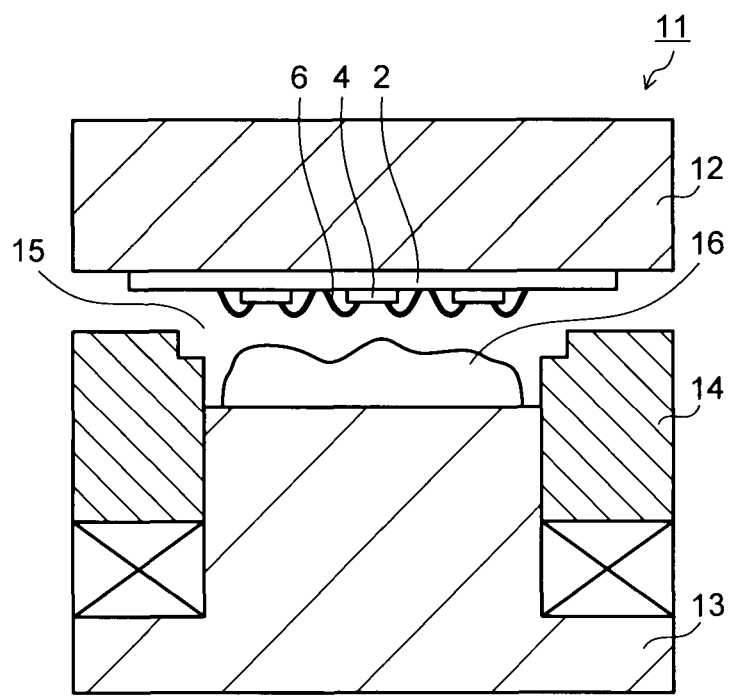
FIG. 2 is a diagram showing a supply process of a sealing resin material in manufacturing steps of the semiconductor device of the embodiment.
Figure 3:
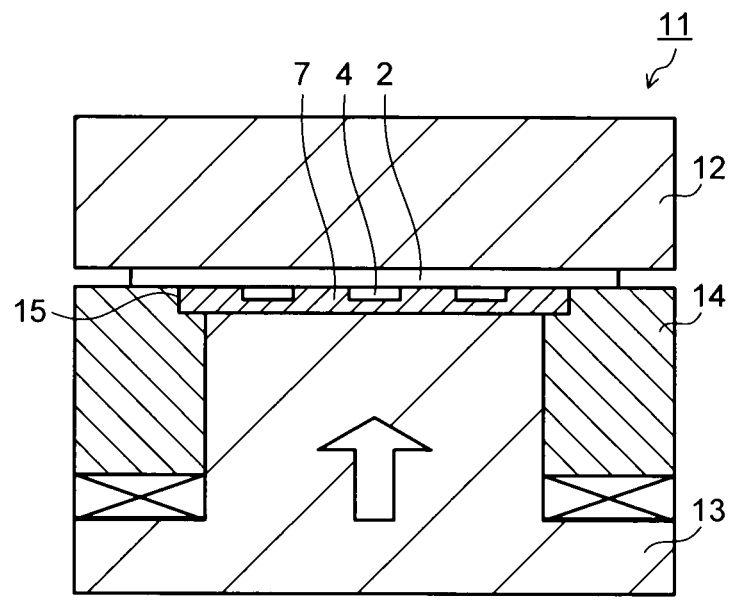
FIG. 3 is a diagram showing a compression molding process of the sealing resin material in the manufacturing steps of the semiconductor device of the embodiment.

A manufacturing method of a semiconductor device according to a first embodiment will be described with reference to FIG. 2 and FIG. 3. First, as shown in FIG. 1, semiconductor chips 4A, 4B are mounted and stacked on a wiring substrate 2, and electrode pads 5s, 5b of the semiconductor chips 4A, 4B are electrically connected to connection pads 3 of the wiring substrate 2 via metal wires 6A, 6B, respectively. As shown in FIG. 2, the wiring substrate 2 on which the semiconductor chips 4A, 4B are mounted is set in a sealing apparatus 11. The sealing apparatus 11 is an apparatus for compression molding.

The sealing apparatus 11 for compression molding includes a pair of upper and lower molds (first and second molds) 12, 13. The wiring substrate 2 on which the semiconductor chip 4 is mounted is set in the upper mold (first mold) 12. The lower mold (second mold) 13 is disposed to face the upper mold 12, and a cavity block 14 to form a cavity 15 is disposed therearound. The cavity 15 is formed, to be more precise, by the upper mold 12, the lower mold 13, and the cavity block 14.

The lower mold 13 is capable of being raised and lowered together with the cavity block 14, and further, raising and lowering of only the lower mold 13 is possible. The lower mold 13 is positioned lower than the cavity block 14 in advance, and a thermosetting sealing resin material 16 being a material to form a sealing resin layer 7 is supplied thereon. The lower mold 13 has a mechanism to heat the sealing resin material 16. A mechanism to raise/lower the lower mold 13 functions as a mechanism to pressurize the sealing resin material 16 having been heated and fluidized. The sealing resin material 16 is compression molded in the cavity 15.

The sealing resin material 16 is made of an uncured thermosetting resin composition and has a powder form for application to compression molding. The thermosetting resin composition is constituted by a thermosetting resin, a curing agent, an inorganic filler, various additive agents, and the like. As a concrete example of the sealing resin material 16, there can be cited a thermosetting epoxy resin composition, a silicone resin composition, a polyimide resin composition and the like.

The epoxy resin composition will be used as an example for explanation. The sealing resin material 16 contains an epoxy resin (thermosetting resin), a curing agent such as a phenol resin curing agent, an inorganic filler such as silica, alumina, a quartz powder, titanium oxide, and calcium carbonate, and further an accelerator, a low stress agent such as a silicone resin and silicone oil, an silane coupling agent and the like, as necessary, and these constituent materials are uniformly kneaded.

Figure 4:
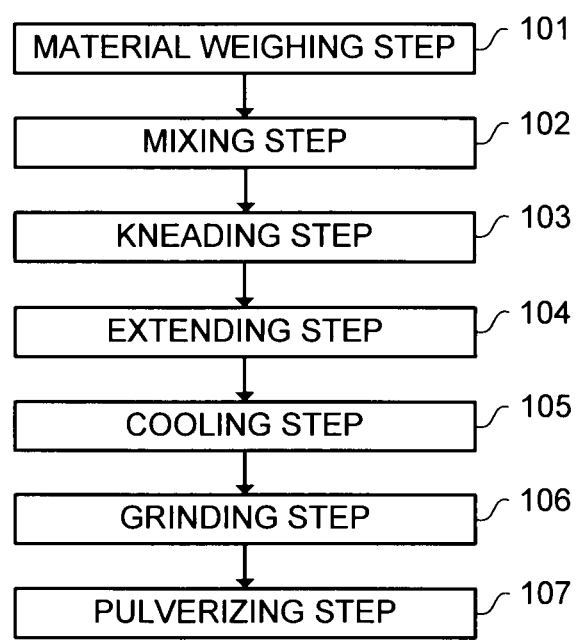
FIG. 4 is a diagram showing manufacturing steps of a sealing resin material used in a first embodiment.

Steps for preparing the sealing resin material 16 will be described with reference to FIG. 4. First, respective materials (uncured thermosetting resin, curing agent, filler, and so on) constituting the sealing resin material 16 of the epoxy resin composition or the like are weighed (101) and mixed (102). Next, a mixed product of the respective materials is kneaded (103). The kneading step 103 is performed while heating approximately at 100° C. in general so that the respective materials are uniformly mixed. On this occasion, there is a resin which resides for a long time in the kneading step, and a thermosetting reaction proceeds, generating a cured product. This cured product is called an acetone insoluble matter.

A kneaded product of the respective materials generated in the kneading step 103 contains the cured product (acetone insoluble matter) of the thermosetting resin described above. Since the acetone insoluble matter gives an adverse influence to a resin sealing step based on its particle diameter, the acetone insoluble matter is pulverized as will be described later. The acetone insoluble matter is not limited to the cured product of the thermosetting resin, but, for example, an aggregation substance of filler (silica or the like), a metal impurity or the like is also included. As described above, the kneaded product contains a solid foreign matter including the cured product of the thermosetting resin as well as the aggregation substance of filler and the metal impurity or the like.

Next, the kneaded product of the respective materials is extended to form a sheet (104), cooled (105) and then ground (106). The grinding step 106 of the kneaded product (resin composition) is performed so that a particle diameter after grinding becomes several ten μm to 2 mm in general. By only performing such a grinding step 106, a particle diameter of the cured product of the thermosetting resin generated in the kneading step 103 is also in a range of several ten μm to 2 mm, and in particular, the acetone insoluble matter containing the cured product of thermosetting resin with a large particle diameter gives an adverse influence to the semiconductor chip 4 or the metal wire 6 in the resin sealing step.

Figure 5:
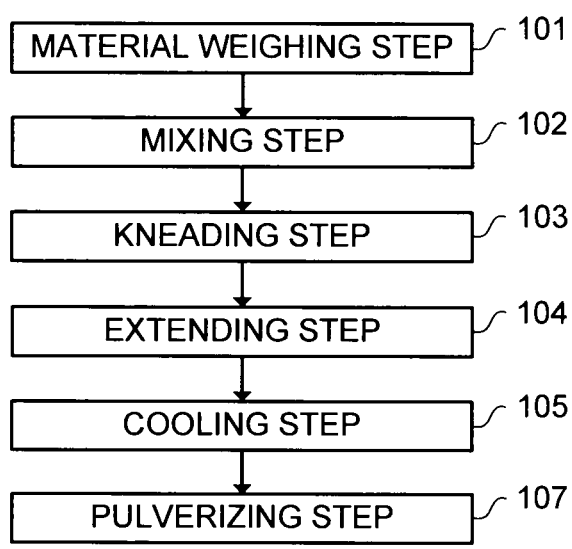
FIG. 5 is a diagram showing a modification example of the manufacturing steps of the sealing resin material shown in FIG. 5.

Thus, after undergoing the kneading step 103 in which the cured product of the thermosetting resin is generated, the extending step 104, the cooling step 105, and the grinding step 106, a pulverizing step 107 of the resin composition is performed. The pulverizing step 107 is a step for pulverizing the resin composition with the solid foreign matter (acetone insoluble matter) having the cured product of the thermosetting resin by using, for example, a fine grinding apparatus. By undergoing the pulverizing step 107, there can be obtained a sealing resin material (thermosetting resin composition) 16 in which the entire resin composition is pulverized with the solid foreign matter (acetone insoluble matter). The pulverizing step 107 may be performed directly after the cooling step 105 without the grinding step 106 as shown in FIG. 5.

As another method of eliminating an acetone insoluble matter with a large particle diameter, for example, sieving to remove a particle with a particle diameter larger than a particle diameter leading to an adverse influence on a semiconductor chip 4 or a metal wire 6 can be considered. However, if sieving is applied, not only the acetone insoluble matter with the large particle diameter but also a sealing resin material with a large particle diameter is removed, so that a usage rate of the sealing resin material becomes extremely low, resulting in increase of a manufacturing cost of a semiconductor device 1. In contrast, by pulverizing the sealing resin material 16 with the solid foreign matter (acetone insoluble matter), increase of the manufacturing cost can be restrained. The cured product of thermosetting resin does not give an adverse influence to resin sealing except an influence by largeness of the particle diameter.

In the above-described pulverizing step 107, the sealing resin material (thermosetting resin composition) 16 is pulverized with the solid foreign matter (acetone insoluble matter), thereby particulates of the sealing resin material having a particle diameter with which the solid foreign matter does not give an adverse influence to the semiconductor chip 4 or the metal wire 6 in the resin sealing step can be obtain. More specifically, pulverizing is performed so that a maximum diameter of the sealing resin material 16 containing the solid foreign matter becomes smaller than the resin thickness-on-chip T after the semiconductor chip 4 is resin sealed. By making the maximum diameter of the solid foreign matter smaller than the resin thickness-on-chip T, there is no possibility that the solid foreign matter damages the semiconductor chip 4 in the later-described resin sealing step.

When the resin thickness-on-chip T of the semiconductor device 1 is 120 μm, the sealing resin material 16 is pulverized so that the maximum diameter of the sold foreign matter is smaller than 120 μm, further 100 μm or less. In order to restrain a crack or the like of the semiconductor chip 4 in the resin sealing step more surely, it is more preferable that the maximum diameter of the solid foreign matter is a value of 85% of the resin thickness-on-chip T (0.85 T) or less. However, if the sealing resin material 16 is pulverized too far, a particle size distribution of the filler contained therein also changes and a characteristic of the sealing resin material 16 changes. It is preferable that the sealing resin material 16 is pulverized so that the particle diameter is the maximum diameter of the filler (for example, 75 μm) or more.

Figure 6:
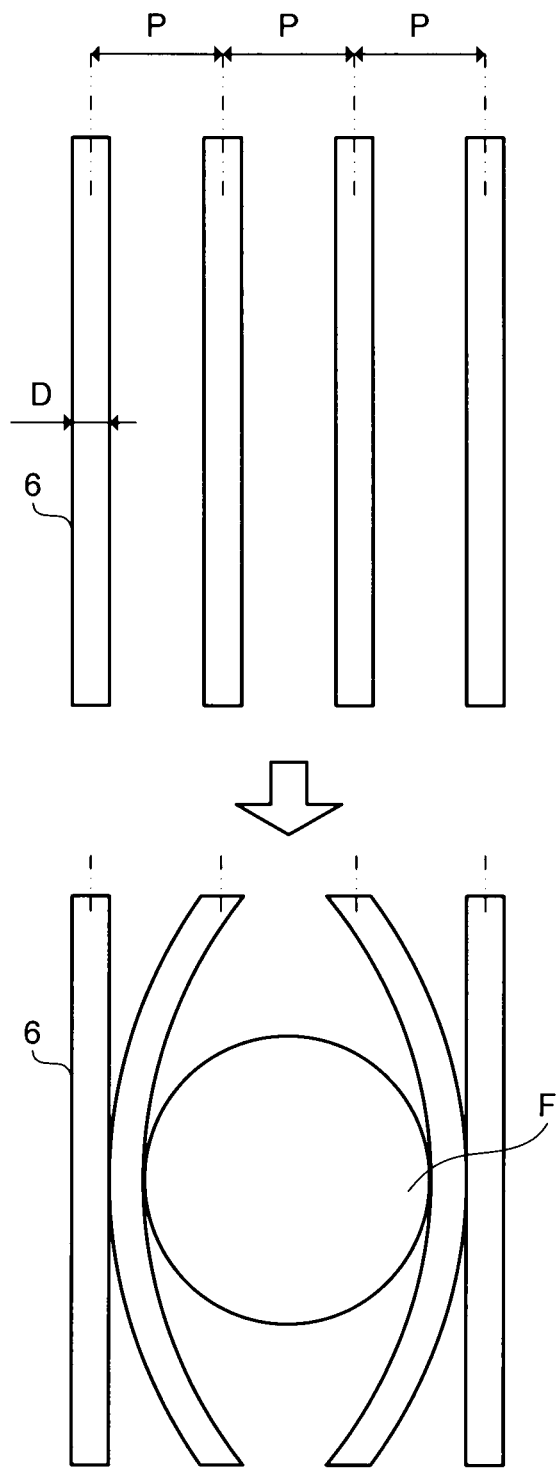
FIG. 6 is a diagram showing a contact state of metal wires based on a relation between a layout pitch and a diameter of the metal wire, and a diameter of a solid foreign matter.

In order to restrain contact between the metal wires 6 or a short circuit thereby due to the acetone insoluble matter containing the cured product of the thermosetting resin, it is preferable that the particle diameter is made equal to or smaller than a particle diameter which does not cause contact between metal wires 6 even in a case that the acetone insoluble matter is sandwiched between the neighboring metal wires 6. As shown in FIG. 6, in a case that a layout pitch of the metal wire 6 is represented by P and a diameter of the metal wire 6 is represented by D, if a particle diameter of a solid foreign matter (acetone insoluble matter) F sandwiched between neighboring metal wires 6 is [3P−3D] or more, a short failure between the metal wires 6 occurs.

It is preferable that the sealing resin material 16 is pulverized so that a maximum diameter of the solid foreign matter F is smaller than a value of [3P−3D]. In a case that the layout pitch P of the metal wire 6 is 60 μm and the diameter D of the metal wire 6 is 25 μm, if the maximum diameter of the solid foreign matter F is smaller than 105 μm, a short circuit between the metal wires 6 can be restrained. Also from such a viewpoint, it is preferable that pulverizing is performed so that the maximum diameter of the solid foreign matter becomes 100 μm or less. In order to restrain a short circuit or a leak between the metal wires 6 due to the solid foreign matter F more surely, it is preferable that the maximum diameter of the solid foreign matter F is a value of 80% of [3P−3D] (0.8[3P−3D]) or less. It is preferable that pulverizing is performed so that the particle diameter of the sealing resin material 16 is the maximum particle diameter of the filler or more.

In this way, the particulates of the sealing resin material (thermosetting resin composition) 16 pulverized with the solid foreign matter having the cured product of the thermosetting resin is prepared. The particulates of the sealing resin material 16 (pulverized sealing resin material) are supplied to the sealing apparatus 11 as described above. More specifically, the particulates of the sealing resin material 16 is supplied onto the lower mold 13 facing the upper mold 12 in which the semiconductor chip 4 mounted on the wiring substrate 2 is set. The upper mold 12 and the lower mold 13 are heated in advance. After the supplied particulates of the sealing resin material 16 melt, the lower mold 13 and the cavity block 14 are raised as shown in FIG. 3.

The lower mold 13 and the cavity block 14 are raised and the cavity block 14 is made contact with the upper mold 12, thereby forming sidewalls of the cavity 15. The lower mold 13 is further raised, thereby pressurizing the molten (fluidized) sealing resin material 16 to be spread in the cavity 15, so that the semiconductor chip 4 is covered with the sealing resin material 16. The sealing resin material 16 filled in the cavity 15 is further heated and thermoset. In this way, the semiconductor chip 4 is sealed with a cured product of the sealing resin material 16. After a thermosetting step ends, the lower mold 13 is lowered and a molded product (wiring substrate 2 having the semiconductor chip 4 sealed with a sealing resin layer 7 made of the cured product of the sealing resin material 16) is taken out.

As described above, the maximum diameter of the solid foreign matter (cured product of the thermosetting resin or the like) contained in the sealing resin material 16 is smaller than the resin thickness-on-chip T and further is 85% of the resin thickness-on-chip T (0.85 T) or less. Thus, even if the solid foreign matter intervenes between the semiconductor chip 4B and the lower mold 13, a pressure of the lower mold 13 does not locally applied to the semiconductor chip 4B. Therefore, it becomes possible to restrain a crack or the like of the semiconductor chip 4 due to the solid foreign matter.

Further, the size of the solid foreign matter (cured product of thermosetting resin or the like) is equal to or smaller than the particle diameter which does not cause contact between the metal wires 6 even if the solid foreign matter is sandwiched between the neighboring metal wires 6 (the maximum diameter of the solid foreign matter is smaller than the value of [3P–3D] against the layout pitch P and the diameter D of the metal wire 6, and further is 80% of [3P–3D] or less). Therefore, it is possible to restrain a short circuit or a leak between the metal wires 6 due to the solid foreign matter. Thereby, it becomes possible to fabricate a highly reliable semiconductor device 1 at a high yield.

Figure 7:
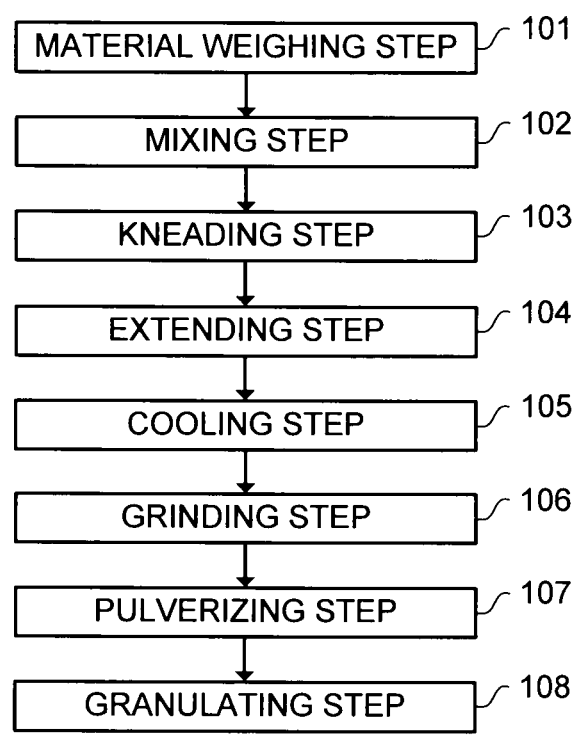
FIG. 7 is a diagram showing manufacturing steps of a sealing resin material used in a second embodiment.

Next, a manufacturing method of a semiconductor device according to a second embodiment will be described. First, similarly to the first embodiment, a wiring substrate 2 on which a semiconductor chip 4 is mounted is set in a sealing apparatus 11. Next, a thermosetting sealing resin material 16 is prepared. The constituent materials of the sealing resin material 16 are the same as those of the first embodiment. The sealing resin material 16 is prepared as follows. Steps for preparing the sealing resin material 16 will be described with reference to FIG. 7. Similarly to the first embodiment, a material weighing step 101, a mixing step 102, a kneading step 103, an extending step 104, a cooling step 105, a grinding step 106, and a pulverizing step 107 are performed.

Figure 8:
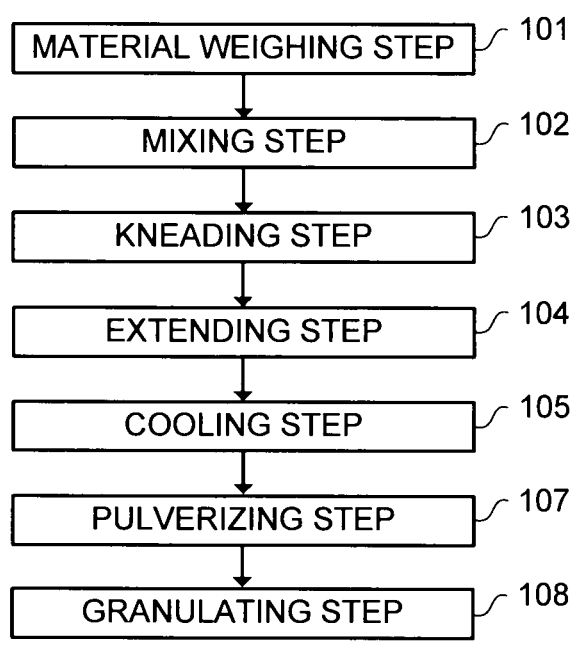
FIG. 8 is a diagram showing a modification example of the manufacturing steps of the sealing resin material shown in FIG. 6.

The pulverizing step 107 is performed similarly to the first embodiment, and the sealing resin material 16 is pulverized with a solid foreign matter so that a size of a solid foreign matter is smaller than a particle diameter which give an adverse influence to a semiconductor chip 4 or a metal wire 6 in a resin sealing step. A maximum diameter of the solid foreign matter is the same as that of the first embodiment. More specifically, it is preferable that the maximum diameter of the solid foreign matter is smaller than the resin thickness-on-chip T and further is the value of 85% of the resin thickness-on-chip T (0.85 T) or less. It is preferable that, with the layout pitch P and the diameter D of the metal wire 6, the maximum diameter of the solid foreign matter is smaller than the value of [3P–3D] and further is the value of 80% of [3P–3D] (0.8[3P–3D]) or less. Furthermore, it is preferable that the sealing resin material 16 is pulverized to have the particle size equal to or larger than the maximum particle diameter of the filler. The pulverizing step 107 may be performed directly after the cooling step 105 without the grinding step 106 as shown in FIG. 8.

Next, the pulverized sealing resin material (particulates of the sealing resin material) 16 is granulated (108). Granulating the pulverized sealing resin material 16 enables elimination of an adverse influence on the semiconductor chip 4 or the metal wire 6 due to the particle diameter of the solid foreign matter and to improve a handling characteristic, a filling characteristic or the like of the sealing resin material 16. A particle diameter of a granulation powder of the sealing resin material 16 can be almost constant or the granulation powder may have a desired particle size distribution. In particular, it is preferable that the granulation power has a particle size distribution described later.

For example, a conventional thermosetting resin composition in granular form has an irregular particle size distribution, causing a problem such that a fine powder attaches/deposits or a granular powder clogs in a resin transforming section, and so on. Further, the granular resin composition is supplied to a lower mold, and then, a metal mold is closed after the granular resin composition melts. Therefore, a melting time of the resin composition affects a productivity of a product. Since a conventional sealing resin material (granular resin composition) has an irregular particle size distribution, the conventional sealing resin material has a problem that many gaps exist between particles and thermal conductivity is low, so that it takes time to raise a temperature of the resin composition or to melt the resin composition, resulting in a low productivity.

With respect to the above, by using the granulation powder obtained by granulating the pulverized sealing resin material 16, attachment/deposition or clogging of the fine powder can be eliminated. Further, it is known that in general a filling factor is larger in a polydisperse system in which particle sizes are different compared with a case that particle sizes are uniform, resulting in a highly dense filling. By granulating the pulverized sealing resin material 16 to have a desired particle size distribution, a filling factor of the sealing resin material (granulation powder) can be made higher.

In Horsfield's packing model, a filling factor in a case that equal sized spherical particles are hexagonally closest packed is approximately 74%. In a case that largest spheres that can fit in quadrangular holes surrounded by six spheres and in triangular holes surrounded by four spheres are sequentially packed, if the first equal sized sphere is a primary sphere, the largest sphere to fit in the quadrangular hole is a secondary sphere, the largest sphere to fit in the triangular hole is a tertiary sphere, the largest sphere to fit in a gap between the primary sphere and the secondary sphere is a biquadratic sphere, and the largest sphere to fit in a gap between the primary sphere and the tertiary sphere is a quintic sphere, and the fine equal sized particles are closest packed in remaining gaps at the last, a filling factor is approximately 96%. More highly dense filling becomes possible by granulating to obtain particle diameters with regularity rather than by granulating to obtain uniform equal sized spheres or irregular sized spheres. Particle diameters and number proportion of the primary sphere to the quintic sphere are represented by a particle size and a number proportion shown in Table 1 when the particle diameter of the primary sphere is A and the number of the primary sphere is 1 (one).

TABLE 1

| Particle | Particle Diameter | Number Proportion |
| --- | --- | --- |
| Primary Sphere | A | 1 |
| Secondary Sphere | 0.414A | 1 |
| Tertiary Sphere | 0.225A | 2 |
| Biquadratic Sphere | 0.177A | 8 |
| Quintic Sphere | 0.116A | 8 |

For example, if granulating is performed so that a particle diameter of a resin composition of a primary sphere is 1 mm, a particle diameter of a secondary sphere is 0.414 mm, a particle diameter of a tertiary sphere is 0.225 mm, a particle diameter of a biquadratic sphere is 0.177 mm, a particle diameter of a quintic sphere is 0.116 mm and so that a number proportion of particles becomes as nearest as possible to primary sphere: secondary sphere: tertiary sphere: biquadratic sphere: quintic sphere=1:1:2:8:8, there can be obtained a powder particle formed resin composition (sealing resin material 16 in powder particle form) with which close packing is possible. The number proportion of the particles is not limited to the above. It suffices that at least the number of the tertiary spheres is larger than each number of the primary spheres or the secondary spheres and each number of the biquadratic spheres or the quintic spheres is larger than the number of the tertiary spheres. The above particle diameters are typical examples of the respective particle diameters and can be varied in a range in which size order of the particle diameters is kept.

By using the granulation powder which has been granulated to have a particle size distribution with regularity after the sealing resin material 16 is once all pulverized, the semiconductor chip 4 is resin sealed. A resin sealing step is performed similarly to the first embodiment. In the second embodiment, the following effects can be attained. In other words, in addition to an effect of the first embodiment, prevention of an adverse influence such that the resin attaches/deposits or the resin clogs in a resin transfer section is possible. Further, a gap between the particles becomes narrow, so that a contact area of the particles increases, resulting in an improved heat receiving efficiency of the resin. Thereby, a melting time of the resin becomes shorter, so that productivity of a product can be improved. Since the sealing resin material 16 is once pulverized and then granulated, usability of the resin is high, so that a cost of a product can be decreased.

Figure 9:
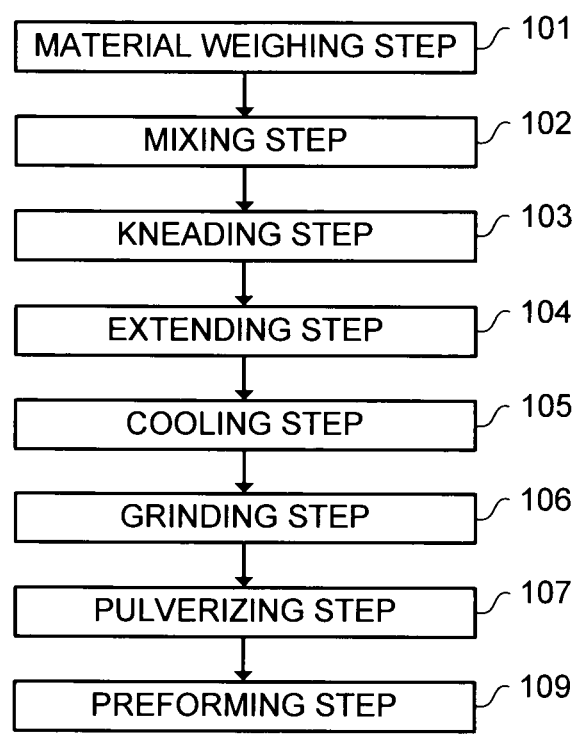
FIG. 9 is a diagram showing manufacturing steps of a sealing resin material used in a third embodiment.

Next, a manufacturing method of a semiconductor device according to a third embodiment will be described. First, similarly to the first embodiment, a wiring substrate 2 on which a semiconductor chip 4 is mounted is set in a sealing apparatus 11. Next, a thermosetting sealing resin material 16 is prepared. The constituent materials of the sealing resin material 16 are the same as those of the first embodiment. The sealing resin material 16 is prepared as follows. Steps for preparing the sealing resin material 16 will be described with reference to FIG. 9. Similarly to the first embodiment, a material weighing step 101, a mixing step 102, a kneading step 103, an extending step 104, a cooling step 105, a grinding step 106, and a pulverizing step 107 are performed. The pulverizing step 107 may be performed directly after the cooling step 105 without the grinding step 106.

The pulverizing step 107 is performed similarly to the first embodiment, and the sealing resin material 16 is pulverized with a solid foreign matter so that a size of a solid foreign matter is smaller than a particle diameter which give an adverse influence to a semiconductor chip 4 or a metal wire 6 in a resin sealing step. A maximum diameter of the solid foreign matter is the same as that of the first embodiment. More specifically, it is preferable that the maximum diameter of the solid foreign matter is smaller than the resin thickness-on-chip T and further is the value of 85% of the resin thickness-on-chip T (0.85 T) or less. It is preferable that, with the layout pitch P and the diameter D of the metal wire 6, the maximum diameter of the solid foreign matter is smaller than the value of [3P−3D] and further is the value of 80% of [3P−3D] (0.8[3P−3D]) or less. Furthermore, it is preferable that the sealing resin material 16 is pulverized to have the particle size equal to or larger than the maximum particle diameter of the filler.

Then, the pulverized sealing resin material (particulates of the sealing resin material) 16 is preformed (109). Preforming the pulverized sealing resin material 16 enables elimination of an adverse influence on the semiconductor chip 4 or the metal wire 6 due to the particle diameter of the solid foreign matter and to improve a handling characteristic, a filling characteristic or the like of the sealing resin material 16. Furthermore, a melting time of the resin becomes shorter, so that productivity of a product can be improved. Since the sealing resin material 16 is once pulverized and then preformed, usability of the resin is high, so that a cost of a product can be decreased.

In the above-described embodiments, examples in which compression molding is applied to resin sealing of the semiconductor chip are described, but the resin sealing step is not limited to by compression molding. A pulverized sealing resin material and a granulated sealing resin material can be effectively used in a resin sealing step to which transfer molding is applied. In particular, a sealing resin material in which, with a layout pitch P and a diameter D of a metal wire, a maximum diameter of a solid foreign matter is smaller than a value of [3P−3D] and further is a value of 80% of [3P−3D] or less effectively functions also in a case that transfer molding is applied. In other words, it becomes possible to effectively restrain occurrence of a short circuit or the like due to contact between metal wires in a resin sealing step to which transfer molding is applied.

Note that the present invention is not limited to the above-described embodiments but can be applied to a manufacturing step (resin sealing step) of various semiconductor devices in which semiconductor chips mounted on circuit substrates such as wiring boards are resin sealed. A manufacturing method of such a semiconductor device is included in the present invention. Further, the embodiments of the present invention can be extended or changed within a scope of the technical idea of the present invention, and the extended and changed embodiments are also included in the technical scope of the present invention.

What is claimed is:

1. A manufacturing method of a semiconductor device comprising:
preparing a sealing resin material, which is made of a kneaded thermosetting resin composition containing a filler, including a solid foreign matter having an acetone insoluble matter, the sealing resin material comprising particulates of the kneaded thermosetting resin composition pulverized with the solid foreign matter;

setting a semiconductor chip mounted on a circuit substrate and electrically connecting to the circuit substrate in a sealing apparatus comprising a pair of compression molds;

supplying the sealing resin material into the sealing apparatus in which the semiconductor chip mounted on the circuit substrate is set;

heating and fluidizing the sealing resin material;

pressurizing the fluidized sealing resin material while heating by the compression molds to cover the semiconductor chip by the fluidized sealing resin material; and thermosetting the fluidized sealing resin material while maintaining a pressurization to seal the semiconductor chip by the cured sealing resin material, wherein the kneaded thermosetting resin composition containing the filler is pulverized with the solid foreign matter so that a maximum diameter of the solid foreign matter is smaller than a thickness T and larger than or equal to a maximum diameter of the filler, wherein the thickness T is a thickness of the cured sealing resin material formed on the semiconductor chip.

2. The manufacturing method as set forth in claim 1, wherein the sealing resin material is pulverized so that the maximum diameter of the solid foreign matter is a value of 0.85 T or less.

3. The manufacturing method as set forth in claim 1, wherein the semiconductor chip is electrically connected to the circuit substrate via metal wires, and the sealing resin material is pulverized so that the maximum diameter of the solid foreign matter is smaller than a value of [3P−3D], where the P is a layout pitch of the metal wires and the D is a diameter of the metal wires.

4. The manufacturing method as set forth in claim 3, wherein the sealing resin material is pulverized so that the maximum diameter of the solid foreign matter is a value of 0.8[3P−3D] or less.

5. The manufacturing method as set forth in claim 1, wherein the sealing resin material is pulverized so that the maximum diameter of the solid foreign matter is 100 μm or less.

6. The manufacturing method as set forth in claim 1, further comprising:

mixing raw materials comprising a thermosetting resin, a curing agent, and the filler to fabricate the thermosetting resin composition;

kneading the thermosetting resin composition while heating to fabricate the kneaded thermosetting resin composition containing the filler, wherein the kneaded thermosetting resin composition includes the solid foreign matter;

cooling the kneaded thermosetting resin composition; and pulverizing a cooled product of the kneaded thermosetting resin composition with the solid foreign matter.

7. The manufacturing method as set forth in claim 6, further comprising, granulating a pulverized product of the kneaded thermosetting resin composite.

8. The manufacturing method as set forth in claim 6, further comprising, performing a pulverized product of the kneaded thermosetting resin composite.

9. The manufacturing method as set forth in claim 1, wherein the sealing apparatus comprises:

a first compression mold in which the semiconductor chip mounted on the circuit substrate is set;

a second compression mold, in which the sealing resin material is set, disposing to face the first compression mold;

a cavity block disposing around the second compression mold to form a cavity; and a mechanism to pressurize the sealing resin material while heating.

10. The manufacturing method as set forth in claim 1, wherein the thickness T of the cured sealing resin material formed on the semiconductor chip is less than 2 mm.

11. The manufacturing method as set forth in claim 1, wherein the thickness T of the cured sealing resin material formed on the semiconductor chip is 150 μm or less.

12. The manufacturing method as set forth in claim 1, further comprising:

mixing raw materials comprising a thermosetting resin, a curing agent, and the filler to fabricate the thermosetting resin composition;

kneading the thermosetting resin composition while heating to fabricate the kneaded thermosetting resin composition containing the filler, wherein the kneaded thermosetting resin composition includes the solid foreign matter;

cooling the kneaded thermosetting resin composition;

grinding a cooled product of the kneaded thermosetting resin composition so as to obtain a ground product of the kneaded thermosetting resin composition having a particle diameter of 2 mm or less; and pulverizing the ground product of the kneaded thermosetting resin composition with the solid foreign matter so that the maximum diameter of the solid foreign matter is smaller than the thickness T and larger than or equal to the maximum diameter of the filler.

* * * * *